(12) United States Patent
Saito et al.

(10) Patent No.: US 11,874,679 B2
(45) Date of Patent: Jan. 16, 2024

(54) USING AN IMAGING DEVICE TO CORRECT POSITIONING ERRORS

(71) Applicant: Mitsubishi Electric Corporation, Tokyo (JP)

(72) Inventors: Akio Saito, Tokyo (JP); Hiroyuki Sekiguchi, Tokyo (JP); Takeyuki Kawata, Tokyo (JP)

(73) Assignee: MITSUBISHI ELECTRIC CORPORATION, Tokyo (JP)

( * ) Notice: Subject to any disclaimer, the term of this patent is extended or adjusted under 35 U.S.C. 154(b) by 324 days.

(21) Appl. No.: 17/296,253

(22) PCT Filed: Jan. 9, 2019

(86) PCT No.: PCT/JP2019/000394
§ 371 (c)(1),
(2) Date: May 24, 2021

(87) PCT Pub. No.: WO2020/144776
PCT Pub. Date: Jul. 16, 2020

(65) Prior Publication Data
US 2022/0004206 A1    Jan. 6, 2022

(51) Int. Cl.
*G06T 5/00* (2006.01)
*G06T 7/00* (2017.01)
(Continued)

(52) U.S. Cl.
CPC ........... *G05D 3/12* (2013.01); *G05B 23/0254* (2013.01); *G06T 3/0068* (2013.01); *G06T 5/003* (2013.01);
(Continued)

(58) Field of Classification Search
None
See application file for complete search history.

(56) References Cited

U.S. PATENT DOCUMENTS

| 10,187,565 B2 * | 1/2019 | Kasahara | G06T 5/002 |
| 2004/0119819 A1 * | 6/2004 | Aggarwal | G08B 13/19641 |
| | | | 348/E7.086 |

(Continued)

FOREIGN PATENT DOCUMENTS

| EP | 3376844 A1 * | 9/2018 | H05K 13/0812 |
| JP | 2006-287199 A | 10/2006 | |

(Continued)

OTHER PUBLICATIONS

International Search Report and Written Opinion dated Feb. 26, 2019, received for PCT Application PCT/JP2019/000394, Filed on Jan. 9, 2019, 7 pages including English Translation.

(Continued)

*Primary Examiner* — Tyler W. Sullivan
(74) *Attorney, Agent, or Firm* — XSENSUS LLP

(57) ABSTRACT

A control device controls a control target apparatus including a moving part and an imaging device. The moving part is configured to change its position relative to a target as the moving part moves, and the imaging device is configured to acquire captured image of the target. Additionally, the control device includes a drive unit that drives the moving part, based on a drive command signal to move the moving part to a target position. Further, the control device includes a relative position estimation unit that calculates an estimated value of a relative position between the target and the imaging device, based on the drive command signal. Additionally, the control device includes a template image correction unit that corrects a preregistered template image, based on a time-series signal of the estimated value of the relative position within an imaging time of the imaging device, and a target position correction unit that corrects the target position using the corrected template image.

7 Claims, 8 Drawing Sheets

(51) Int. Cl.
  *G05B 23/02* (2006.01)
  *G06T 3/00* (2006.01)
  *G06V 10/24* (2022.01)
  *G06V 10/44* (2022.01)
  *G06V 10/88* (2022.01)
  *G06V 30/146* (2022.01)
  *G05D 3/12* (2006.01)
  *H05K 13/08* (2006.01)
  *G06V 10/75* (2022.01)
  *B25J 9/00* (2006.01)
  *B25J 15/06* (2006.01)

(52) U.S. Cl.
  CPC .............. *G06T 7/001* (2013.01); *G06V 10/24* (2022.01); *G06V 10/443* (2022.01); *G06V 10/75* (2022.01); *G06V 10/88* (2022.01); *G06V 30/146* (2022.01); *H05K 13/081* (2018.08); *B25J 9/0093* (2013.01); *B25J 15/0616* (2013.01); *G06T 2207/20201* (2013.01)

(56) References Cited

U.S. PATENT DOCUMENTS

2007/0294875 A1   12/2007   Hachiya et al.
2020/0060052 A1*   2/2020   Amano ................. G06T 3/4053

FOREIGN PATENT DOCUMENTS

JP     2015-213139 A    11/2015
WO     2018/154691 A1    8/2018

OTHER PUBLICATIONS

Office Action dated Jun. 29, 2023 in corresponding Chinese Patent Application No. 201980087703.3 and machine English translation thereof, 18 pages.

\* cited by examiner

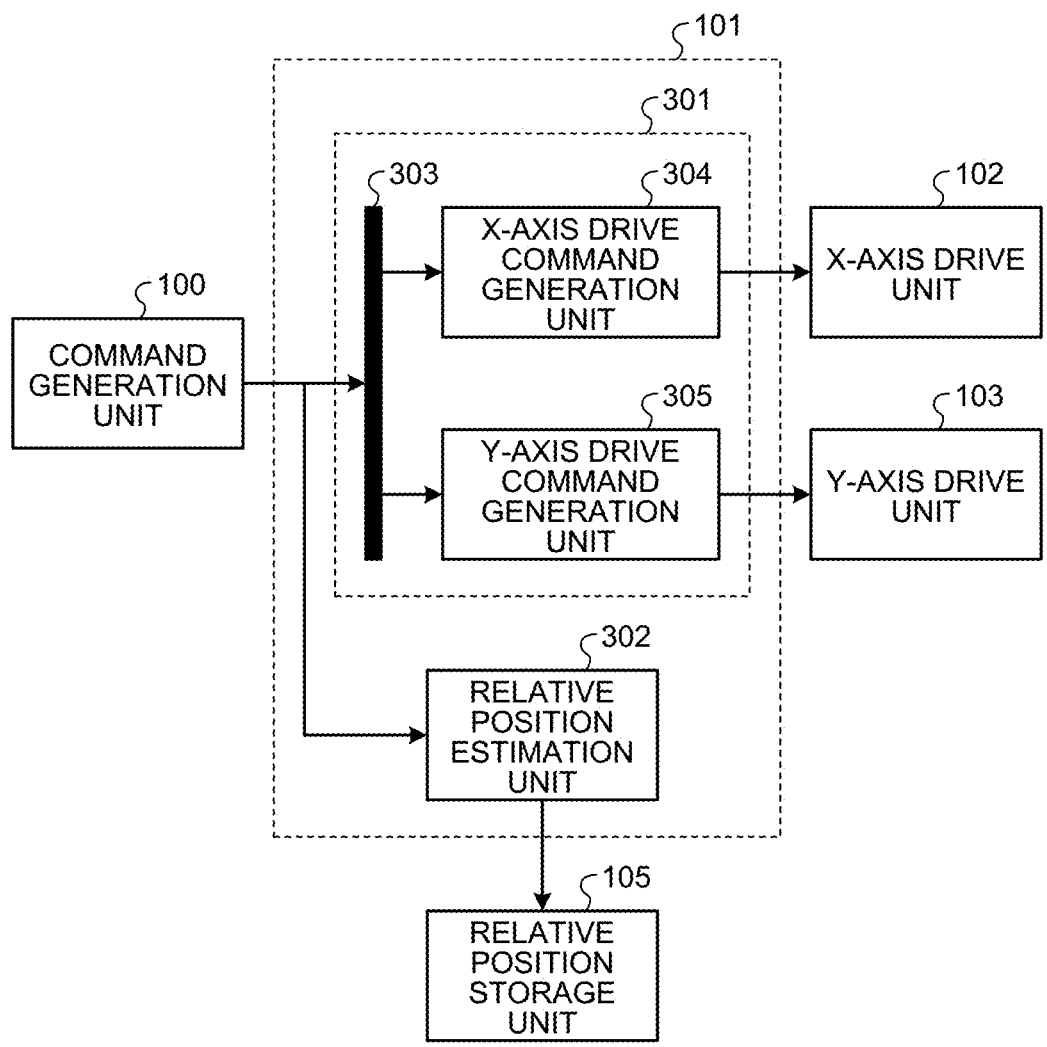

USING AN IMAGING DEVICE TO CORRECT POSITIONING ERRORS

CROSS-REFERENCE TO RELATED APPLICATION

The present application is based on PCT filing PCT/JP2019/000394, filed Jan. 9, 2019, the entire contents of which are incorporated herein by reference.

FIELD

The present invention relates to a control device and a control method that use an imaging device to correct a target position to which a moving part such as a mounting head driven using an actuator is to be moved.

BACKGROUND

Machine tools such as electronic component mounters and semiconductor manufacturing equipment perform positioning control to move a moving part such as a mounting head to a target position by driving actuators such as servo motors or linear motors. For such machine tools, there is known a technique for correcting position errors caused by variation or deformation of an object being worked on, thermal expansion of the apparatuses themselves, or the like, based on images captured by an imaging device.

Patent Literature 1 discloses a component mounting apparatus including a mounting head and an imaging device. The component mounting apparatus has the function of acquiring the outline of a component held by the mounting head from the brightness distribution of a captured image acquired by the imaging device, and correcting the mounting position of the component, based on the acquired outline position of the component. At this time, the component mounting apparatus performs imaging without temporarily stopping the mounting head, thereby shortening the time required to complete positioning. At this time, the relative speed between the subject and the imaging device is not zero.

CITATION LIST

Patent Literature

Patent Literature 1: Japanese Patent Application Laid-open No. 2006-287199

SUMMARY

Technical Problem

However, according to the above conventional technique, since the relative speed between the subject and the imaging device is not zero, the relative position between the subject and the imaging device changes during exposure, and the captured image is blurred. This causes a problem in that it cannot be uniquely determined which time during exposure time period the outline position of the component acquired from the captured image corresponds to, resulting in a reduction in the accuracy of correcting position errors.

The present invention has been made in view of the above. It is an object of the present invention is to provide a control device capable of accurately correcting position errors.

Solution to Problem

To solve the aforementioned problems and achieve the object, a control device according to the present invention is a control device to control a control target apparatus including a moving part and an imaging device to change a position relative to a target as the moving part moves and acquire a captured image of the target, the device including: a drive unit to drive the moving part, based on a drive command signal to move the moving part to a target position; a relative position estimation unit to calculate an estimated value of a relative position between the target and the imaging device, based on the drive command signal; a template image correction unit to correct a preregistered template image, based on a time-series signal of the estimated value of the relative position within an imaging time of the imaging device; and a target position correction unit to correct the target position using the corrected template image.

Advantageous Effects of Invention

The present invention has the advantage of being able to provide a control device capable of accurately correcting position errors.

BRIEF DESCRIPTION OF DRAWINGS

FIG. 6 is a block diagram illustrating an exemplary configuration of a machine model calculation unit illustrated in FIG. 5.

FIG. 7 is a diagram illustrating an example of a template image before being corrected by a template image correction unit illustrated in FIG. 5.

DESCRIPTION OF EMBODIMENTS

Hereinafter, a control device and a control method according to embodiments of the present invention will be described in detail with reference to the drawings. The embodiments are not intended to limit the invention.

First Embodiment

Figure 1:
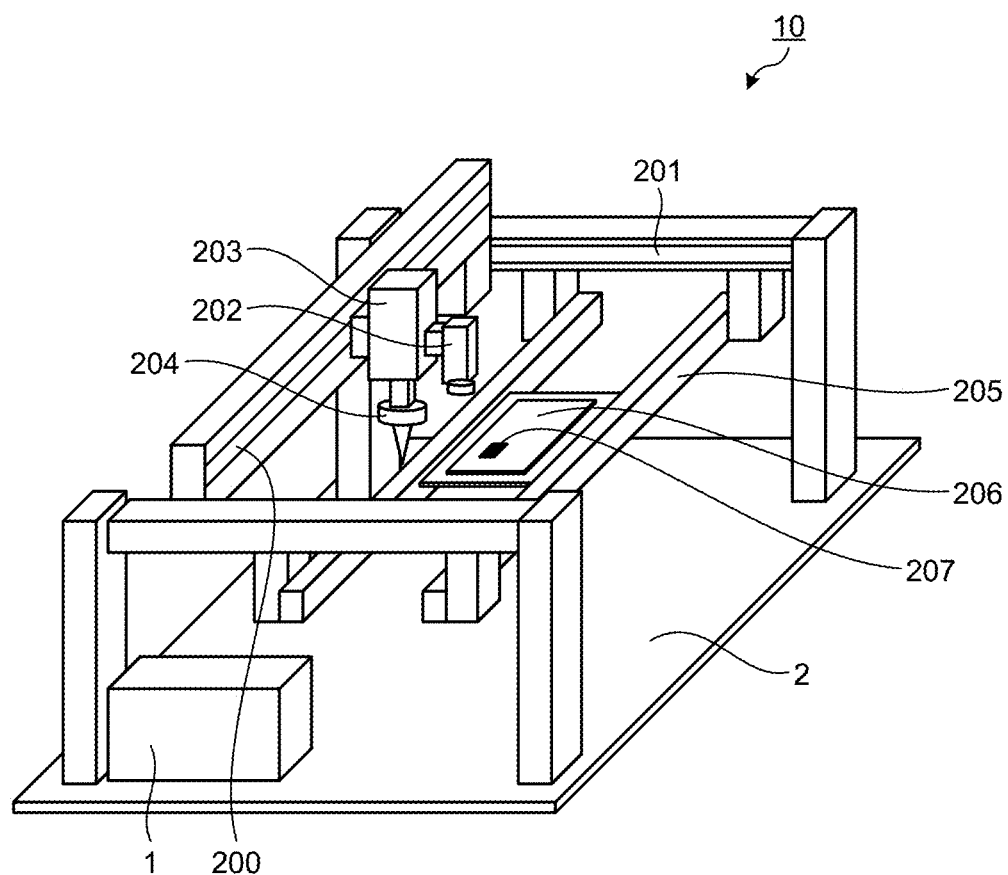
FIG. 1 is a schematic diagram illustrating a configuration of a control system according to a first embodiment of the present invention.

FIG. 1 is a schematic diagram illustrating a configuration of a control system 10 according to a first embodiment of the present invention. The control system 10 includes a control device 1 and a control target apparatus 2 that is a mechanical system to be controlled by the control device 1. In the present embodiment, the control target apparatus 2 is an electronic component mounter that mounts electronic components on a board. The control device 1 controls the operation of each part of the control target apparatus 2. The control target apparatus 2 includes an X-axis motor 200, a Y-axis motor 201, an imaging device 202, a moving part 203, a suction nozzle 204, and a printed-circuit board transport mechanism 205.

The X-axis motor 200 and the Y-axis motor 201 are actuators that change the position of the moving part 203. The direction in which the X-axis motor 200 moves the moving part 203 is orthogonal to the direction in which the Y-axis motor 201 moves the moving part 203. The moving part 203 is a mounting head for mounting an electronic component, and is moved in parallel with the surface of a printed-circuit board 206 by the X-axis motor 200 and the Y-axis motor 201. The moving part 203 holds an electronic component and places the electronic component at a target position 207 on the printed-circuit board 206, using the suction nozzle 204. Although the X-axis motor 200 and the Y-axis motor 201 are illustrated as linear motors in FIG. 1, other linear-motion mechanisms such as a combination of a rotary servo motor and a ball screw may be used.

The imaging device 202 is fixed to the moving part 203, and moves as the moving part 203 moves. Thus, the relative position between the imaging device 202 and the printed-circuit board transport mechanism 205, which is a target, changes as the moving part 203 moves.

The printed-circuit board transport mechanism 205 transports the printed-circuit board 206, according to commands from the control device 1. The target position 207 is a position to which the moving part 203 is to be moved, and is a position at which an electronic component is provided on the printed-circuit board 206.

Figure 2:
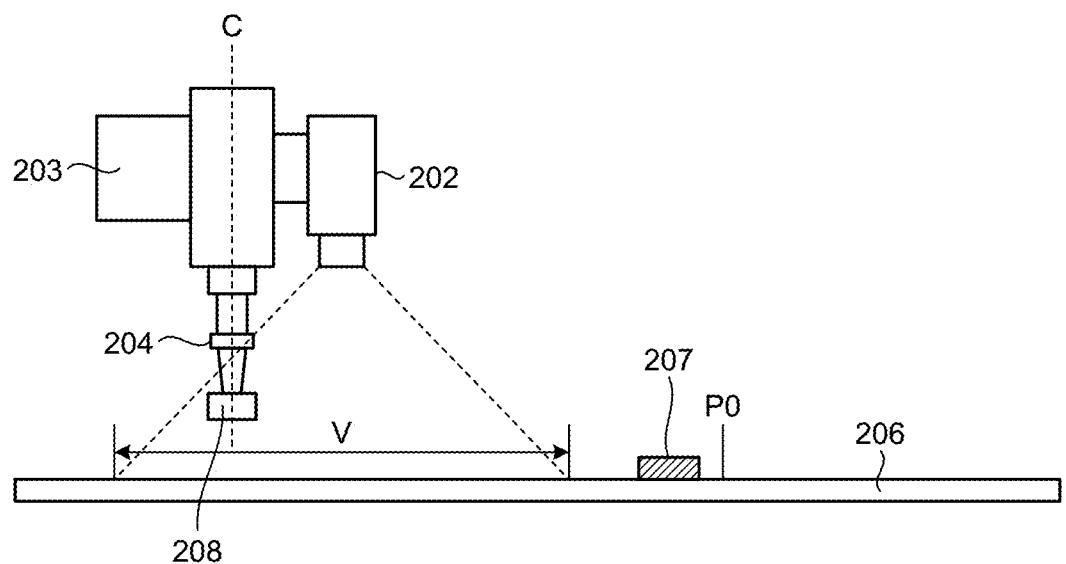
FIG. 2 is a diagram illustrating a first state of the control system illustrated in FIG. 1.
Figure 3:
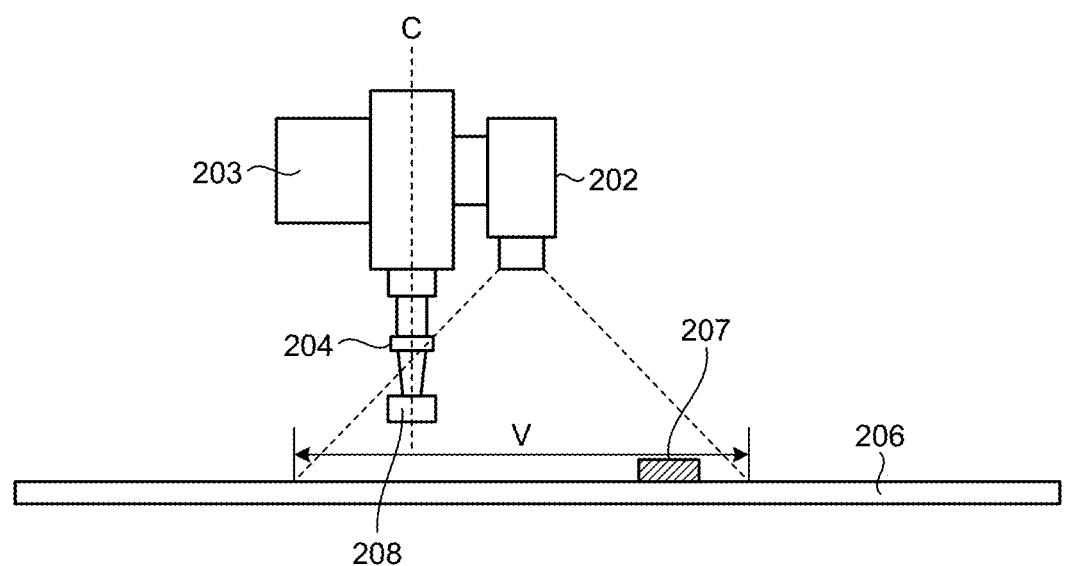
FIG. 3 is a diagram illustrating a second state of the control system illustrated in FIG. 1.
Figure 4:
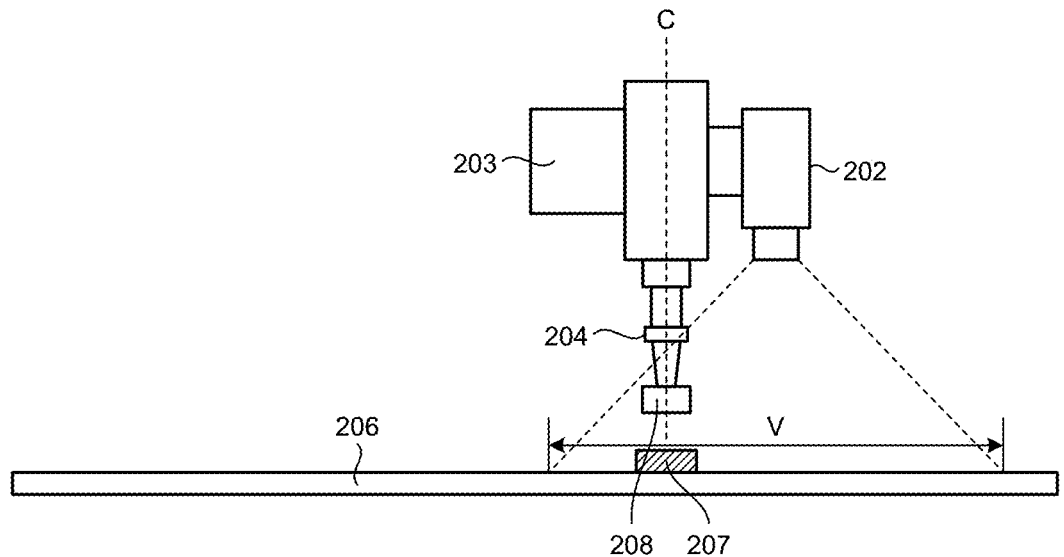
FIG. 4 is a diagram illustrating a third state of the control system illustrated in FIG. 1.

Hereinafter, a basic operation of the control system 10 will be described. FIG. 2 is a diagram illustrating a first state of the control system 10 illustrated in FIG. 1. FIG. 3 is a diagram illustrating a second state of the control system 10 illustrated in FIG. 1. FIG. 4 is a diagram illustrating a third state of the control system 10 illustrated in FIG. 1. Here, an operation of sucking an electronic component 208 with the suction nozzle 204 of the moving part 203 and placing the electronic component 208 at the target position 207 will be described.

First, in the first state illustrated in FIG. 2, the control system 10 is performing the positioning control on the moving part 203. In the first state, the target position 207 is not within the field of view V of the imaging device 202. The control device 1 performs the positioning control on the moving part 203, using a default target position PO that is preset based on design data of the printed-circuit board 206. If the printed-circuit board 206 is warped or the control target apparatus 2 is thermally expanded, an error can occur, causing the target position 207 at which the electronic component 208 should actually be mounted to be different from the default target position P0. If the electronic component 208 is placed on the printed-circuit board 206 with the moving part 203 positioned at the default target position P0 without change, the control device 1 places the electronic component 208 on the printed-circuit board 206 with the moving part 203 moved such that the central axis C of the suction nozzle 204 coincides with the default target position P0, so that the electronic component 208 is placed at a position different from the position at which it should actually be placed.

Therefore, the control system 10 has a function of correcting the default target position P0, using images captured by the imaging device 202. When the target position 207 enters the field of view V of the imaging device 202 as in the second state illustrated in FIG. 3, the control device 1 calculates the relative position between the moving part 203 and the target position 207 from an image captured by the imaging device 202, and based on the calculated relative position, performs positioning control while correcting an error between the target position 207 and the default target position P0. With this control, finally, as in the third state illustrated in FIG. 4, the central axis C of the suction nozzle 204 coincides with the center position of the target position 207, and the positioning control is completed.

Figure 5:
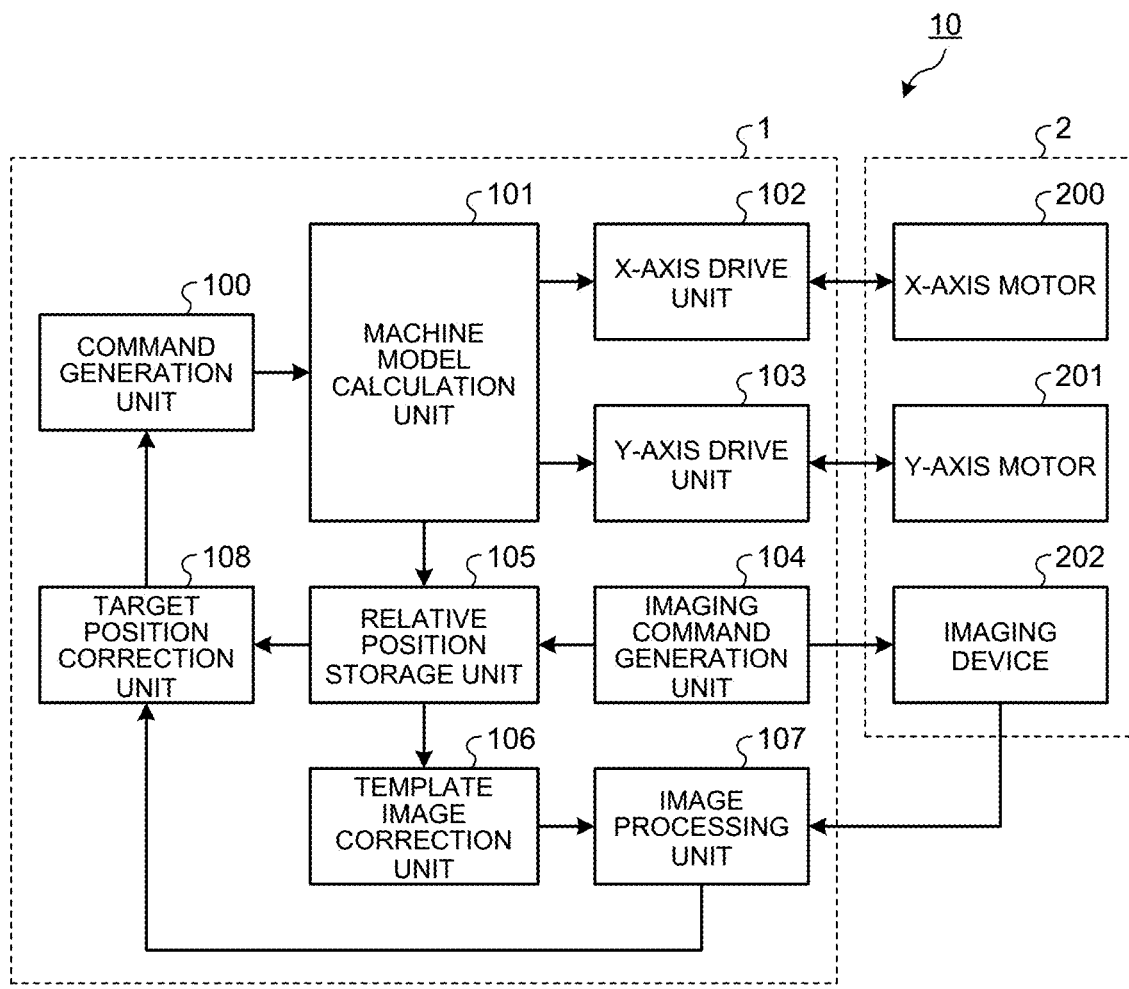
FIG. 5 is a diagram illustrating a functional configuration of the control system illustrated in FIG. 1.

FIG. 5 is a diagram illustrating a functional configuration of the control system 10 illustrated in FIG. 1. The control system 10 includes the control device 1 and the control target apparatus 2. The control device 1 includes a command generation unit 100, a machine model calculation unit 101, an X-axis drive unit 102 and a Y-axis drive unit 103 constituting a drive unit, an imaging command generation unit 104, a relative position storage unit 105, a template image correction unit 106, an image processing unit 107, and a target position correction unit 108. The control device 1 controls the X-axis motor 200 and the Y-axis motor 201, based on captured images acquired by the imaging device 202 mounted on the control target apparatus 2.

The command generation unit 100 calculates a position command including an X-axis command position rx(t) and a Y-axis command position ry(t), based on a current target position P(t). As a technique for generating a position command by performing interpolation on a target position that changes from moment to moment, for example, a method disclosed in Japanese Patent Application Laid-open No. 2015-213139 can be used. The command generation unit 100 inputs the generated position command to the machine model calculation unit 101.

The machine model calculation unit 101 calculates a drive command signal including X-axis and Y-axis current feedforward signals, in which the gain of frequency components that excite the mechanical vibration of the control target apparatus 2 is reduced to reduce the vibration of the control target apparatus 2, and position reference signals indicating a position that the moving part 203 needs to follow to move the moving part 203 to the target position P(t), using a method described below, based on transfer functions indicating the mechanical characteristics of the control target apparatus 2, and the position command including the X-axis command position rx(t) and the Y-axis command position ry(t) calculated by the command generation unit 100. In parallel with the above operation, the machine model calculation unit 101 calculates an estimated value of the relative position between the imaging device 202 and the target position 207 when the X-axis drive unit 102 and the Y-axis drive unit 103 perform control based on the drive command signal. The machine model calculation unit 101 inputs the calculated drive command signal to the X-axis drive unit 102 and the Y-axis drive unit 103, and inputs the estimated value of the relative position to the relative position storage unit 105.

FIG. 6 is a block diagram illustrating an exemplary configuration of the machine model calculation unit 101 illustrated in FIG. 5. The machine model calculation unit 101 illustrated in FIG. 6 includes a drive command generation unit 301 and a relative position estimation unit 302. The drive command generation unit 301 includes a command distributor 303, an X-axis drive command generation unit 304, and a Y-axis drive command generation unit 305.

The current value of the X-axis motor 200 at time t is denoted as ux(t), and the position feedback value of the X-axis motor 200 at time t is denoted as x1($t$). Likewise, the current value of the Y-axis motor 201 at time t is denoted as uy(t), and the position feedback value of the Y-axis motor 201 at time t is denoted as y1($t$). The X component of the relative position between the imaging device 202 and the target position 207 at time t is denoted as x2($t$), and the Y component as y2($t$).

Assume that by identifying the mechanical characteristics of the control target apparatus 2 in advance, the denominator polynomial Dx(s) and the numerator polynomial Nx1($s$) of the transfer function from the current value to the position feedback value of the X-axis motor 200, and the denominator polynomial Dy(s) and the numerator polynomial Ny1($s$) of the transfer function from the current value to the position feedback value of the Y-axis motor 201 have been obtained in advance. These relationships are expressed by formula (1) below. Here, the Laplace transform of function f(t) is expressed as L[f(t)].

[Formula 1]

$$\begin{cases} \frac{L[x_1(t)]}{L[u_x(t)]} = \frac{N_{x1}(s)}{D_x(s)} \\ \frac{L[y_1(t)]}{L[u_y(t)]} = \frac{N_{y1}(s)}{D_y(s)} \end{cases} \quad (1)$$

Likewise, assume that the denominator polynomial Dx(s) and the numerator polynomial Nx2($s$) of the transfer function from the current value of the X-axis motor 200 to the X component of the relative position between the imaging device 202 and the target position 207, and the denominator polynomial Dy(s) and the numerator polynomial Ny2($s$) of the transfer function from the current value of the Y-axis motor 201 to the Y component of the relative position between the imaging device 202 and the target position 207 have been obtained in advance. These relationships are expressed by formula (2) below. The denominator polynomials Dx(s) and Dy(s) of the transfer functions in formula (2) are the same as those in formula (1).

[Formula 2]

$$\begin{cases} \frac{L[x_2(t)]}{L[u_x(t)]} = \frac{N_{x2}(s)}{D_x(s)} \\ \frac{L[y_2(t)]}{L[u_y(t)]} = \frac{N_{y2}(s)}{D_y(s)} \end{cases} \quad (2)$$

The transfer functions in formula (1) and formula (2) can be obtained by performing a test of operating the control target apparatus 2, acquiring time-series data of the current values and position feedback values of the X-axis motor 200 and the Y-axis motor 201 and measured values of the relative position between the imaging device 202 and the target position 207, and performing signal processing on the time-series data. Assume that by adjusting the position feedback and the scale of the relative position, the numerator polynomials of the transfer functions have been normalized as in formula (3) shown below.

[Formula 3]

$$\begin{cases} N_{x1}(0) = 1 \\ N_{y1}(0) = 1 \\ N_{x2}(0) = 1 \\ N_{y2}(0) = 1 \end{cases} \quad (3)$$

The X-axis command position rx(t) and the Y-axis command position ry(t) calculated by the command generation unit 100 are input to the command distributor 303 of the drive command generation unit 301 and the relative position estimation unit 302. The command distributor 303 inputs the X-axis command position rx(t) calculated by the command generation unit 100 to the X-axis drive command generation unit 304, and inputs the Y-axis command position ry(t) calculated by the command generation unit 100 to the Y-axis drive command generation unit 305.

At this time, the X-axis drive command generation unit 304 calculates a current feedforward signal ux*(t) and a position reference signal x1*($t$) for the X-axis motor 200, based on transfer functions shown in formula (4) below, using the transfer function Fx(s) of a preset X-axis command filter and the transfer function expressed in formula (1).

[Formula 4]

$$\begin{cases} \frac{L[u_x^*(t)]}{L[r_x(t)]} = D_x(s)F_x(s) \\ \frac{L[x_1^*(t)]}{L[r_x(t)]} = N_{x1}(s)F_x(s) \end{cases} \quad (4)$$

Likewise, the Y-axis drive command generation unit 305 calculates a current feedforward signal uy*(t) and a position reference signal y1*($t$) for the Y-axis motor 201, based on transfer functions shown in formula (5) below, using the transfer function Fy(s) of a preset Y-axis command filter and the transfer function expressed in formula (1).

[Formula 5]

$$\begin{cases} \frac{L[u_y^*(t)]}{L[r_y(t)]} = D_y(s)F_y(s) \\ \frac{L[y_1*(t)]}{L[r_y(t)]} = N_{y1}(s)F_y(s) \end{cases} \quad (5)$$

The relative position estimation unit 302 calculates the X component and the Y component of the estimated value of the relative position, based on transfer functions shown in formula (6) below, using the transfer functions Fx(s) and Fy(s) of the command filters described above and the transfer functions in formula (2). In the following description, an estimated value of a function may be denoted with a hat added to the function. In the text, a function with a hat may be expressed as hat(function). For example, the estimated value of the function x2($t$) is expressed as hat (x2)($t$). In formula (6), hat (x2)($t$) represents the X component of the estimated value of the relative position, and hat(y2)($t$) represents the Y component of the estimated value of the relative position.

[Formula 6]

$$\begin{cases} \dfrac{L[\hat{x}_2(t)]}{L[r_x(t)]} = N_{x2}(s)F_x(s) \\ \dfrac{L[\hat{y}_2(t)]}{L[r_y(t)]} = N_{y2}(s)Fy(s) \end{cases} \quad (6)$$

Formula (4) indicates that the X-axis drive command generation unit 304 calculates the current feedforward signal ux*(t) for the X-axis motor 200, based on the transfer function obtained by multiplying the transfer function Fx(s) of the X-axis command filter by the denominator polynomial Dx(s) of the transfer function from the current value to the position feedback of the X-axis, and calculates the X-axis position reference signal x1*(t), based on the transfer function obtained by multiplying the transfer function Fx(s) of the X-axis command filter by the numerator polynomial Nx1(s) of the transfer function from the current value to the position feedback of the X-axis.

Like formula (4), formula (5) indicates that the Y-axis drive command generation unit 305 calculates the current feedforward signal uy*(t) for the Y-axis motor 201, based on the transfer function obtained by multiplying the transfer function Fy(s) of the Y-axis command filter by the denominator polynomial Dy(s) of the transfer function from the current value to the position feedback of the Y-axis, and calculates the Y-axis position reference signal y1*(t), based on the transfer function obtained by multiplying the transfer function Fy(s) of the Y-axis command filter by the numerator polynomial Ny1(s) of the transfer function from the current value to the position feedback of the Y-axis.

Formula (6) indicates that the relative position estimation unit 302 calculates the X component hat(x2)(t) of the estimated value of the relative position, based on the transfer function obtained by multiplying the transfer function Fx(s) of the X-axis command filter by the numerator polynomial Nx2(s) of the transfer function from the current value to the relative position of the X-axis. Formula (6) also indicates that the relative position estimation unit 302 calculates the Y component hat(y2)(t) of the estimated value of the relative position, based on the transfer function obtained by multiplying the transfer function Fy(s) of the Y-axis command filter by the numerator polynomial Ny2(s) of the transfer function from the current value to the relative position of the Y-axis.

The X-axis drive command generation unit 304 inputs the current feedforward signal ux*(t) and the position reference signal x1*(t) for the X-axis motor 200, which are the X-axis drive command signal, to the X-axis drive unit 102. The Y-axis drive command generation unit 305 inputs the current feedforward signal uy*(t) and the position reference signal y1*(t) for the Y-axis motor 201, which are the Y-axis drive command signal, to the Y-axis drive unit 103. The relative position estimation unit 302 inputs the X component hat(x2)(t) of the estimated value of the relative position and the Y component hat(y2)(t) of the estimated value of the relative position it has calculated to the relative position storage unit 105.

The description will return to FIG. 5. The X-axis drive unit 102 performs the position control on the X-axis motor 200 by two-degree-of-freedom control combining feedforward control and feedback control, based on the current feedforward signal ux*(t) and the position reference signal x1*(t) for the X-axis motor 200, which are the X-axis drive command signal, calculated by the machine model calculation unit 101.

The Y-axis drive unit 103 performs the position control on the Y-axis motor 201 by two-degree-of-freedom control combining feedforward control and feedback control, based on the current feedforward signal uy*(t) and the position reference signal y1*(t) for the Y-axis motor 201, which are the Y-axis drive command signal, calculated by the machine model calculation unit 101.

As described above, by calculating current feedforward signals and position reference signals for the X-axis and the Y-axis using formula (4) and formula (5), the gain of frequency components that excite the vibration of the mechanical system included in the current feedforward signals and the position reference signals can be reduced. Thus, the vibration of the mechanical system can be reduced by controlling the X-axis motor 200 and the Y-axis motor 201 by the two-degree-of-freedom control using the current feedforward signals and the position reference signals.

Furthermore, by calculating the X component hat(x2)(t) of the estimated value of the relative position and the Y component hat(y2)(t) of the estimated value of the relative position between the imaging device 202 and the target position 207, using formula (6), the relative position between the imaging device 202 and the target position 207 when the two-degree-of-freedom control is performed can be accurately estimated, taking the vibration, displacement, etc. of the control target apparatus 2 and the imaging device 202 into consideration.

Here, an example has been described in which the machine model calculation unit 101 outputs a set of current feedforward signals and position reference signals as a drive command signal. As another exemplary configuration, the machine model calculation unit 101 may output a set of current feedforward signals, position reference signals, and speed reference signals as a drive command signal. In place of the current feedforward signal, the machine model calculation unit 101 may output a torque feedforward signal as a feedforward signal.

The imaging command generation unit 104 generates an imaging command for controlling the imaging timing of the imaging device 202, based on a predetermined image processing cycle. The imaging command generation unit 104 inputs the generated imaging command to the imaging device 202 and the relative position storage unit 105.

The relative position storage unit 105 receives the input of the X component hat(x2)(t) of the estimated value of the relative position and the Y component hat(y2)(t) of the estimated value of the relative position calculated by the machine model calculation unit 101, and the imaging command generated by the imaging command generation unit 104. The relative position storage unit 105 stores, as a relative position memory, a time-series signal of the X component hat(x2)(t) of the estimated value of the relative position and the Y component hat(y2)(t) of the estimated value of the relative position from the exposure start time to the exposure end time of the imaging device 202.

The template image correction unit 106 corrects a template image to be used by the image processing unit 107, based on the relative position memory stored in the relative position storage unit 105, and calculates a reference position in the template image to be used by the image processing unit 107 for calculating an observed value of the relative position. Here, the template image is a pattern image used in an image processing method such as template matching. In the present embodiment, the template image refers to an image including the target position 207, obtained by photographing the printed-circuit board 206 in advance in a state where the moving part 203 is stationary. The template image correction unit 106 simulates blurring of a captured image, based on the relative position memory, and corrects the template image based on the simulation results.

The image processing unit 107 calculates the observed value of the relative position between the imaging device 202 and the target position 207 by searching for an area matching a pre-registered template image from a captured image captured by the imaging device 202 during positioning, using an image processing method such as template matching. At this time, due to the captured image acquired during positioning, the relative position between the imaging device 202 performing imaging and the target position 207 changes, causing subject blurring. Consequently, the template image photographed in the stationary state does not exactly match the actually captured image. Thus, image processing using the template image captured in the stationary state as it is causes an error in the calculation of the observed value of the relative position.

Against this, in the present embodiment, in a stage before the image processing unit 107 performs image processing, the template image correction unit 106 predicts subject blurring and corrects the template image, based on the relative position memory stored in the relative position storage unit 105, thereby allowing the reduction of an error in the observed value of the relative position caused by the subject blurring. The template image correction unit 106 corrects the template image so that the template image includes subject blurring.

An example of a specific operation of the template image correction unit 106 will be described below. First, based on the relative position memory stored in the relative position storage unit 105, the template image correction unit 106 calculates a filter M corresponding to subject blurring that is caused by changes in the relative position between the imaging device 202 and the target position 207 during imaging of the imaging device 202.

An example of a calculation formula of the filter coefficient of the pixel coordinates (X, Y) of the filter M is expressed by formula (7) below. In formula (7), T1 is the exposure start time of the imaging device 202, T2 is the exposure end time of the imaging device 202, Te is the exposure time period of the imaging device 202, ΔX is the length per pixel in the X-axis direction, and ΔY is the length per pixel in the Y-axis direction. δ(.) represents the Dirac delta function.

[Formula 7]

$$M(X, Y) = \frac{1}{T_e} \int_{X-1/2}^{X+1/2} \int_{Y-1/2}^{Y+1/2} \int_{T_1}^{T_2} \delta\left(x - \frac{\hat{x}_2(t) - \hat{x}_2(T_1)}{\Delta X}\right) \delta\left(y - \frac{\hat{y}_2(t) - \hat{y}_2(T_1)}{\Delta Y}\right) dxdydt \quad (7)$$

In formula (7), the difference between the estimated value of the relative position at exposure start time T1 and the estimated value of the relative position at time t is converted into pixels, and the delta function offset by distance in pixels are integrated over time [T1, T2], and then the average is taken in the surrounding ±½ pixel range.

In formula (7), pixel coordinates (X, Y) can take negative values. Thus, when formula (7) is implemented by a computer, proper offset values are added to logical pixel coordinates (X, Y) to prevent the pixel coordinates on implementation from being negative values.

Next, the template image correction unit 106 calculates the convolution sum of a preregistered template image K and the above-described filter M based on formula (8), thereby calculating a corrected template image K' taking subject blurring into consideration. The template image correction unit 106 inputs the corrected template image K' to the image processing unit 107.

[Formula 8]

$$K'(X, Y) = \sum_{\xi} \sum_{\eta} K(\xi, \eta) M(X - \xi, Y - \eta) \quad (8)$$

Figure 8:
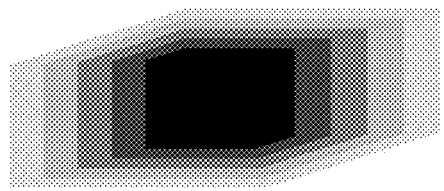
FIG. 8 is a diagram illustrating a template image after correction of the template image illustrated in FIG. 7.

FIG. 7 is a diagram illustrating an example of the template image K before being corrected by the template image correction unit 106 illustrated in FIG. 5. The template image K is an image captured in the stationary state. FIG. 8 is a diagram illustrating the template image K' after correction of the template image K illustrated in FIG. 7. The template image K' is an image taking subject blurring into account, obtained by calculating the convolution sum of the template image K illustrated in FIG. 7 and the filter M.

Figure 9:
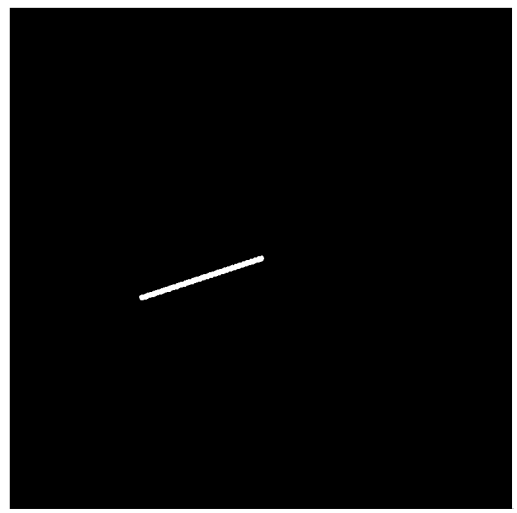
FIG. 9 is a diagram illustrating an example of the filter coefficient of the pixel coordinates of a filter used by the template image correction unit illustrated in FIG. 5.

FIG. 9 is a diagram illustrating an example of the filter coefficient of the pixel coordinates of the filter M used by the template image correction unit 106 illustrated in FIG. 5. The filter coefficient of each pixel of the filter M can be obtained by numerically calculating formula (7) based on the estimated value of the relative position at time [T1, T2]. In FIG. 9, pixels whose filter coefficient is zero are depicted in black, and pixels whose filter coefficient is nonzero are depicted brightly, that is, in white according to the magnitude of the filter coefficient. The corrected template image K' illustrated in FIG. 8 is obtained by calculating the convolution sum of the template image K illustrated in FIG. 7 and the filter M illustrated in FIG. 9.

The image processing unit 107 receives the input of the captured image captured by the imaging device 202 and the corrected template image K' output by the template image correction unit 106. The image processing unit 107 searches for an area in the captured image matching the corrected template image K', using an image processing method such as template matching. At this time, since the filter coefficient is designed based on the estimated value of the relative position at exposure start time T1 in formula (8), the subject position at the exposure start time T1 can be calculated by calculating the pixel coordinates in the captured image corresponding to the logical origin of the corrected template image K'.

Here, as an example of the image processing method, a case where the most basic template matching algorithm is used will be described. In that case, the captured image is scanned with the corrected template image K', the degree of similarity with the corrected template image K' in each area on the captured image is calculated, and an area with the largest degree of similarity or a degree of similarity greater than or equal to a preset threshold value is determined. Next, an observed value of the relative position between the imaging device 202 and the target position 207 is calculated, based on the pixel coordinates corresponding to the logical origin of the corrected template image K' in the determined area.

In the above description, the case where the template image correction unit 106 performs the calculation of the convolution sum of the template image K and the filter M in the space domain has been described. If the image processing unit 107 performs position estimation by an image processing method using the discrete Fourier transform such as phase-only correlation, the template image correction unit 106 may calculate the discrete Fourier transform of the corrected template image K' by calculating discrete Fourier transforms of the template image K and the filter M, and further multiplying them in the spatial frequency domain. The template image correction unit 106 may store a result of calculation of the discrete Fourier transform of the template image K performed offline in advance, instead of calculating the discrete Fourier transform of the template image K online. Using this configuration enables a reduction in the amount of calculation compared to the case where the discrete Fourier transform is performed on the corrected template image K' calculated in the space domain. The image processing unit 107 inputs the observed value of the relative position between the imaging device 202 and the target position 207 to the target position correction unit 108.

The target position correction unit 108 receives the input of the relative position memory stored in the relative position storage unit 105, and the observed value of the relative position between the imaging device 202 and the target position 207. The target position correction unit 108 generates a target position correction signal indicating the correction amount of the target position, and inputs the generated target position correction signal to the command generation unit 100.

For example, when the filter coefficient calculation formula shown in formula (7) is used, since the filter coordinate system is set based on the estimated value of the relative position at exposure start time T1, the correction amount of the target position for the command generation unit 100 can be calculated, based on the error between the estimated value of the relative position at exposure start time T1 and the observed value of the relative position obtained by the image processing. Thus, the calculation formula of the filter coefficient of the filter M may be changed to formula (9) shown below, and the correction amount of the target position for the command generation unit 100 may be calculated, based on the error between the estimated value of the relative position at exposure end time T2 and the observed value of the relative position obtained by the image processing.

[Formula 9]

$$M(X, Y) = \frac{1}{T_e} \int_{X-1/2}^{X+1/2} \int_{Y-1/2}^{Y+1/2} \int_{T_1}^{T_2} \delta\left(x - \frac{\hat{x}_2(t) - \hat{x}_2(T_2)}{\Delta X}\right) \delta\left(y - \frac{\hat{y}_2(t) - \hat{y}_2(T_2)}{\Delta Y}\right) dxdydt \quad (9)$$

If the dead time of follow-up delay of the X-axis drive unit 102 and the Y-axis drive unit 103 has been able to be identified in advance, the filter coefficient calculation may use the estimated value of the relative position at a time corrected for the dead time instead of using the estimated value of the relative position from the exposure start time T1 to the exposure end time T2. In this case, the relative position storage unit 105 may store, as a relative position memory, a time-series signal of the X component hat(x2)(t) of the estimated value of the relative position and the Y component hat(y2)(t) of the estimated value of the relative position in a time range obtained by correcting the exposure start time T1 and the exposure end time T2 for the dead time.

Figure 10:
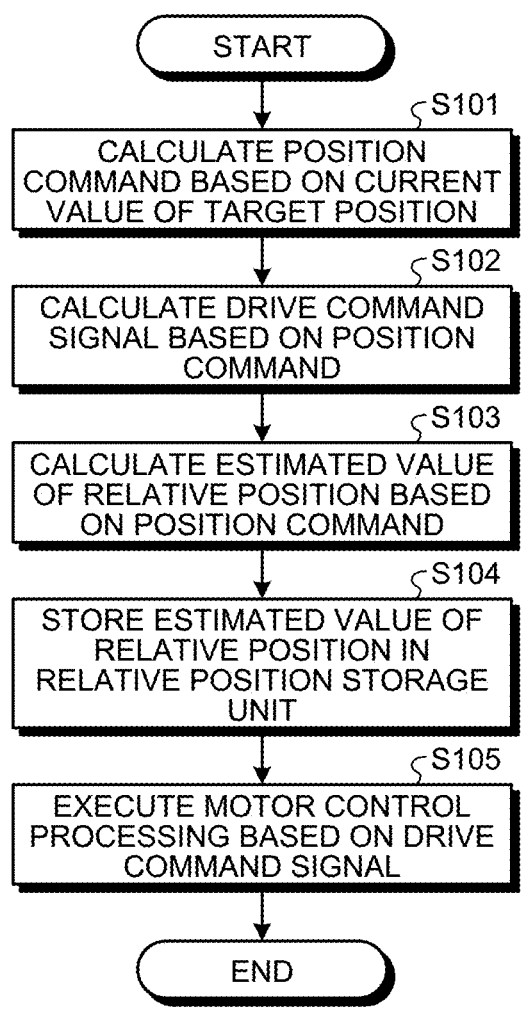
FIG. 10 is a flowchart illustrating drive control processing in a control device illustrated in FIG. 5.

FIG. 10 is a flowchart illustrating drive control processing of the control device 1 illustrated in FIG. 5.

Figure 11:
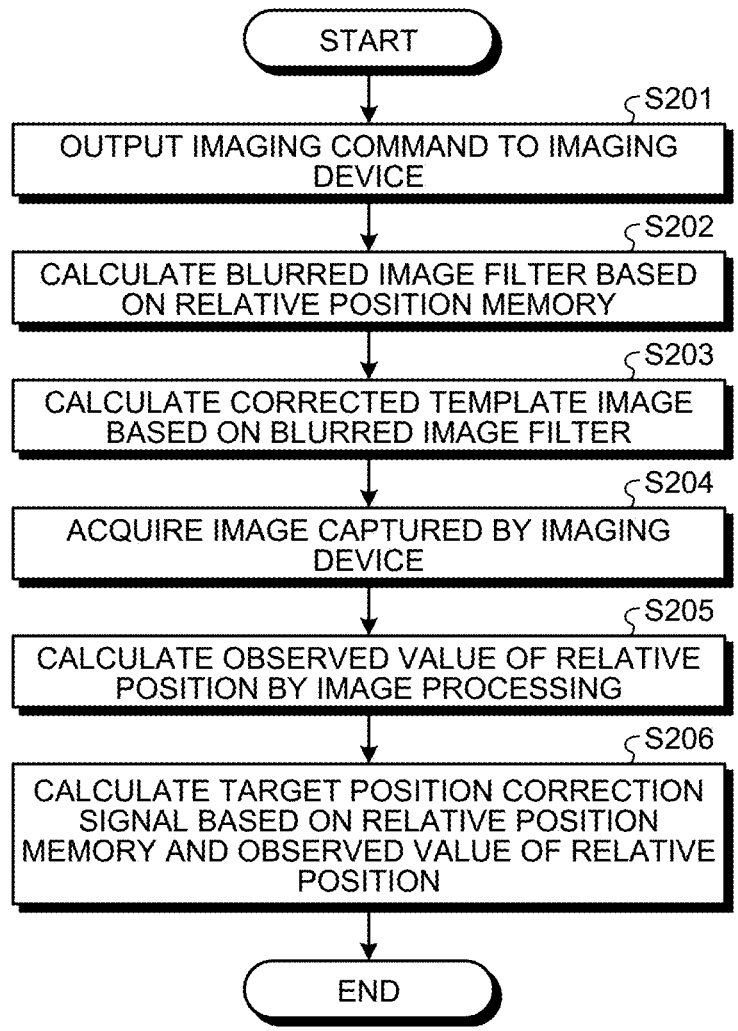
FIG. 11 is a flowchart illustrating image processing in the control device illustrated in FIG. 5.

FIG. 11 is a flowchart illustrating image processing of the control device 1 illustrated in FIG. 5. Generally, the calculation cycle of the image processing must be made longer than the calculation cycle of the drive control processing due to constraints such as the exposure time period of the imaging device 202, the image data transfer rate, and the image processing calculation amount. Therefore, the control device 1 separates a drive control processing task and an image processing task, and executes the tasks with different calculation cycles. If the control device 1 includes a plurality of Central Processing Units (CPUs), the tasks may be assigned to different CPUs.

First, the drive control processing will be described. As illustrated in FIG. 10, the command generation unit 100 of the control device 1 calculates a position command, based on the current value of the target position (step S101). The command generation unit 100 inputs the calculated position command to the machine model calculation unit 101.

The machine model calculation unit 101 calculates a drive command signal to move the moving part 203 to the target position, based on the position command (step S102). The machine model calculation unit 101 inputs the calculated drive command signal to the X-axis drive unit 102 and the Y-axis drive unit 103. Further, the machine model calculation unit 101 calculates an estimated value of the relative position between the imaging device 202 and the target position, based on the position command (step S103). The machine model calculation unit 101 inputs the calculated estimated value of the relative position to the relative position storage unit 105.

The relative position storage unit 105 stores the estimated value of the relative position input from the machine model calculation unit 101 (step S104). The drive unit including the X-axis drive unit 102 and the Y-axis drive unit 103 executes control processing on a motor including the X-axis motor 200 and the Y-axis motor 201, based on the drive command signal (step S105).

Next, the image processing will be described. As illustrated in FIG. 11, the imaging command generation unit 104 of the control device 1 outputs an imaging command to the imaging device 202 (step S201). The template image correction unit 106 calculates a blurred image filter, based on the relative position memory (step S202). The template image correction unit 106 calculates a corrected template image, based on the blurred image filter (step S203). The template image correction unit 106 inputs the corrected template image to the image processing unit 107.

The image processing unit 107 acquires an image captured by the imaging device 202 (step S204). The image processing unit 107 calculates an observed value of the relative position between the imaging device 202 and the target position by the image processing (step S205). The image processing unit 107 inputs the calculated observed value of the relative position to the target position correction unit 108. The target position correction unit 108 calculates a target position correction signal indicating the correction amount of the target position based on the estimated value of the relative position indicated by the relative position memory and the observed value of the relative position (step S206).

Next, a hardware configuration of the present embodiment will be described. The command generation unit 100, the machine model calculation unit 101, the X-axis drive unit 102, the Y-axis drive unit 103, the imaging command generation unit 104, the relative position storage unit 105, the template image correction unit 106, the image processing unit 107, and the target position correction unit 108 are implemented by processing circuits. The processing circuits may be implemented by dedicated hardware, or may be a control circuit using a CPU.

Figure 12:
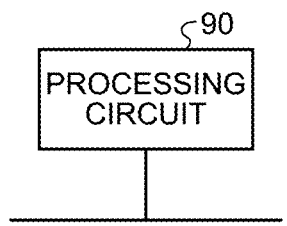
FIG. 12 is a diagram illustrating dedicated hardware for implementing the functions of the control device illustrated in FIG. 5.

When the above processing circuits are implemented by dedicated hardware, they are implemented by a processing circuit 90 illustrated in FIG. 12. FIG. 12 is a diagram illustrating dedicated hardware for implementing the functions of the control device 1 illustrated in FIG. 5. The processing circuit 90 is a single circuit, a combined circuit, a programmed processor, a parallel-programmed processor, an Application Specific Integrated Circuit (ASIC), a Field Programmable Gate Array (FPGA), or a combination of them.

Figure 13:
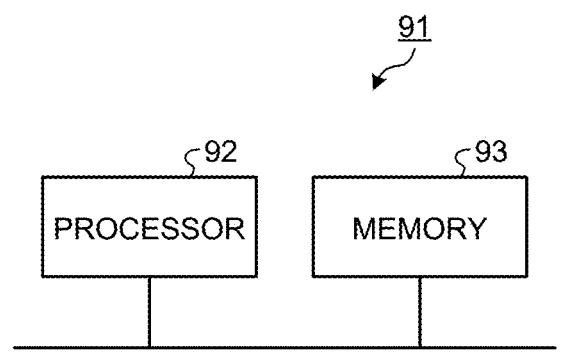
FIG. 13 is a diagram illustrating a configuration of a control circuit for implementing the functions of the control device illustrated in FIG. 5.

When the above processing circuits are implemented by a control circuit using a CPU, the control circuit is, for example, a control circuit 91 of the configuration illustrated in FIG. 13. FIG. 13 is a diagram illustrating the configuration of the control circuit 91 for implementing the functions of the control device 1 illustrated in FIG. 5. As illustrated in FIG. 13, the control circuit 91 includes a processor 92 and memory 93. The processor 92 is a CPU, and is also called a central processing unit, a processing unit, an arithmetic unit, a microprocessor, a microcomputer, a Digital Signal Processor (DSP), or the like. The memory 93 is nonvolatile or volatile semiconductor memory such as Random Access Memory (RAM), Read Only Memory (ROM), a flash memory, an Erasable Programmable ROM (EPROM), or an Electrically EPROM (EEPROM) (registered trademark), or a magnetic disk, a flexible disk, an optical disk, a compact disk, a mini disk, a Digital Versatile Disk (DVD), or the like.

When the processing circuits are implemented by the control circuit 91, they are implemented by the processor 92 reading and executing programs corresponding to the processing of the components stored in the memory 93. The memory 93 is also used as temporary memory in individual processing executed by the processor 92.

As described above, the control device 1 according to the present embodiment performs position estimation by image processing while predicting subject blurring and correcting the template image K, based on the estimated value of the relative position between the imaging device 202 and the target position 207. This enables accurate correction of position errors caused by subject blurring in the positioning control, and enables improvement in the accuracy of the positioning control. This method is also applicable to a case where the shape of the subject is complicated and a case where the subject shape is greatly distorted due to subject blurring, and is highly versatile.

In general, a mechanical system like the control target apparatus 2 has finite mechanical rigidity. Thus, there is a problem in that increasing the acceleration or deceleration of a positioning command may cause vibration in the mechanical system, thereby increasing positioning time.

Against this problem, the control device 1 according to the present embodiment controls the X-axis drive unit 102 and the Y-axis drive unit 103, using the current feedforward signals and the position reference signals as shown in formula (4) and formula (5), thereby allowing the reduction of mechanical vibration after the completion of positioning and the reduction of positioning time.

Further, during positioning, the mechanical rigidity of the mechanical system causes displacement, vibration, etc. to occur between the imaging device 202 and the target position 207. Thus, if the mechanical characteristics of the mechanical system are not taken into account, there is a problem in that errors occur in position estimation by image processing.

Against this problem, the control device 1 according to the present embodiment calculates the correction amount of the target position, based on the estimated value of the relative position between the imaging device 202 and the target position 207 taking the mechanical characteristics into consideration as shown in formula (6). This can prevent a decrease in the position estimation accuracy of the image processing caused by the misalignment of the imaging device 202 due to the vibration and displacement of the mechanical system, thereby enabling high-speed and high-accuracy positioning.

The configuration described in the above embodiment illustrates an example of the subject matter of the present invention, and can be combined with another known art, and can be partly omitted or changed without departing from the scope of the present invention.

For example, although an example in which the control device 1 is applied to positioning control has been described in the above embodiment, the present embodiment is not limited to this example. The method by which the control device 1 corrects a template image used for image processing, based on a prediction about subject blurring can also be applied to motion control devices other than positioning control, such as trajectory control devices and roll-to-roll mechanical systems.

Further, although an example in which the drive command signal and the estimated value of the relative position are calculated, using the transfer functions representing the mechanical characteristics of the control target apparatus 2 has been described in the above embodiment, the present embodiment is not limited to this example. If the mechanical rigidity of the control target apparatus 2 is sufficiently high, or it is difficult to identify the mechanical characteristics, the drive command signal and the estimated value of the relative position can be calculated without using the detailed mechanical characteristics of the control target apparatus 2. In this case, for example, the drive command generation unit 301 and the relative position estimation unit 302 can be configured on the assumption that the control target apparatus 2 is a rigid body, that is, on the assumption that the transfer functions of the X axis and the Y axis of the control target apparatus 2 can be expressed by formula (10) below. Here, Jx is the X-axis rigid-body inertia, and Jy is the Y-axis rigid-body inertia.

[Formula 10]

$$\begin{cases} \dfrac{L[x_1(t)]}{L[u_x(t)]} = \dfrac{L[x_2(t)]}{L[u_x(t)]} = \dfrac{1}{J_x s^2} \\ \dfrac{L[y_1(t)]}{L[u_y(t)]} = \dfrac{L[y_2(t)]}{L[u_y(t)]} = \dfrac{1}{J_y s^2} \end{cases} \quad (10)$$

In the above embodiment, an example in which the imaging device 202 is placed on the moving part 203 constituting the mounting head has been described. The technique of the present embodiment can also be applied to a machine in which the moving part 203 is a table for moving a target, and the relative position between the imaging device 202 and the target changes as the target moves.

In the above embodiment, the machine model calculation unit 101 estimates the relative position between the imaging device 202 and the target position 207 only from the mechanical characteristics identified in advance and information on the command position output by the command generation unit 100. If the control target apparatus 2 includes additional sensors such as an acceleration sensor, the relative position between the imaging device 202 and the target position 207 can be estimated by an observer using their detection values.

In the above embodiment, the configuration and the control method of the control device 1 have been described. However, the technique disclosed in the present embodiment may be implemented as a computer program for implementing the control method of the control device 1, or may be implemented as a storage medium storing the computer program.

REFERENCE SIGNS LIST 1 control device; 2 control target apparatus; control system; 90 processing circuit; 91 control circuit; 92 processor; 93 memory; 100 command generation unit; 101 machine model calculation unit; 102 X-axis drive unit; 103 Y-axis drive unit; 104 imaging command generation unit; 105 relative position storage unit; 106 template image correction unit; 107 image processing unit; 108 target position correction unit; 200 X-axis motor; 201 Y-axis motor; 202 imaging device; 203 moving part; 204 suction nozzle; 205 printed-circuit board transport mechanism; 206 printed-circuit board; 207 target position; 208 electronic component; 301 drive command generation unit; 302 relative position estimation unit; 303 command distributor; 304 X-axis drive command generation unit; 305 Y-axis drive command generation unit; C central axis; PO default target position; V field of view.

The invention claimed is:

1. A control device to control a control target apparatus including a mounting head and an imaging device to change a position relative to a target as the mounting head moves and acquire a captured image of the target, the control device comprising:
drive circuitry to drive the mounting head, based on a drive command signal to move the mounting head to a target position; and
processing circuitry configured to:
calculate an estimated value of a relative position between the target and the imaging device, based on the drive command signal,
correct a preregistered template image, based on a time-series signal of the estimated value of the relative position within an imaging time of the imaging device resulting in a corrected template image,
correct the target position using the corrected template image,
calculate the corrected template image in a spatial frequency domain by performing an operation to apply a filter to the corrected template image in the spatial frequency domain,
the control device further comprising:
an image processor to output an observed value of the relative position by image processing based on the captured image and the corrected template image in the spatial frequency domain, and correct the target position, based on the estimated value and the observed value.

2. The control device according to claim 1, wherein the processing circuitry is further configured to:
simulate blurring of the captured image based on the time-series signal to generate a simulation result, and correct the template image based on the simulation result.

3. The control device according to claim 1, wherein the processing circuitry is further configured to:
calculate, based on the time-series signal, the filter corresponding to blurring of the captured image caused by a change in the relative position during imaging of the imaging device.

4. The control device according to claim 1, further comprising:
the processing circuitry is further configured to correct the target position, based on the estimated value and the observed value of the relative position.

5. The control device according to claim 4, wherein the image processor outputs the observed value using template matching.

6. The control device according to claim 1, wherein the processing circuitry is further configured to:
calculate a drive command signal including a current feedforward signal, in which gain of a frequency component exciting mechanical vibration of the control target apparatus is reduced, and a position reference signal that the mounting head needs to follow, based on a transfer function indicating mechanical characteristics of the control target apparatus, and input the drive command signal to the drive circuitry, calculate, based on the transfer function, the estimated value of the relative position when the drive circuitry performs two-degree-of-freedom control using the current feedforward signal and the position reference signal.

7. A control method for a control device to control a control target apparatus including a mounting head and an imaging device to change a position relative to a target as the mounting head moves and acquire a captured image of the target, the method comprising:
calculating an estimated value of a relative position between the target and the imaging device, based on a drive command signal input to drive circuitry to drive the mounting head;
correcting a preregistered template image, based on a time-series signal of the estimated value of the relative position within an imaging time of the imaging device resulting in a corrected template image;
correcting the target position to which the mounting head is to be moved using the corrected template image;
calculating the corrected template image in a spatial frequency domain by performing an operation to apply a filter to the corrected template image in the spatial frequency domain;
outputting an observed value of the relative position by image processing based on the captured image and the corrected template image in the spatial frequency domain; and
correcting the target position, based on the estimated value and the observed value.

* * * * *